(12) United States Patent
Edelen et al.

(10) Patent No.: US 7,142,456 B2
(45) Date of Patent: Nov. 28, 2006

(54) DISTRIBUTED PROGRAMMED MEMORY CELLS USED AS MEMORY REFERENCE CURRENTS

(75) Inventors: John G. Edelen, Lexington, KY (US); Paul W. Graf, Lexington, KY (US)

(73) Assignee: Lexmark International, Lexington, KY (US)

( * ) Notice: Subject to any disclaimer, the term of this patent is extended or adjusted under 35 U.S.C. 154(b) by 76 days.

(21) Appl. No.: 10/961,465

(22) Filed: Oct. 8, 2004

(65) Prior Publication Data

US 2006/0077708 A1 Apr. 13, 2006

(51) Int. Cl.
G11C 11/34 (2006.01)
G11C 7/00 (2006.01)

(52) U.S. Cl. .............. 365/185.2; 365/189.07; 365/210

(58) Field of Classification Search ............. 365/185.2, 365/210, 189.07
See application file for complete search history.

(56) References Cited

U.S. PATENT DOCUMENTS

| 5,629,892 A | * | 5/1997 | Tang ..................... 365/185.2 |
| 6,411,549 B1 | * | 6/2002 | Pathak et al. ............ 365/185.2 |
| 6,674,679 B1 | * | 1/2004 | Perner et al. ............... 365/209 |
| 6,717,876 B1 | | 4/2004 | Vlasenko et al. |
| 6,731,534 B1 | | 5/2004 | Fan |
| 2003/0011379 A1 | * | 1/2003 | Khoury ..................... 324/529 |

* cited by examiner

*Primary Examiner*—Son T. Dinh
(74) *Attorney, Agent, or Firm*—Thompson Hine LLP

(57) ABSTRACT

A memory circuit for an inkjet print head having a plurality of memory cells switchably connected to a source and configured in an array, wherein at least one of the memory cells is a reference memory cell and at least one of the remaining cells are data memory cells, and at least one sense amplifier adapted to compare at least one of a current and voltage received from the reference memory cell with at least one of a current and voltage received from one of the data memory cells and generate an output based on the comparison.

21 Claims, 2 Drawing Sheets

DISTRIBUTED PROGRAMMED MEMORY CELLS USED AS MEMORY REFERENCE CURRENTS

BACKGROUND

The present invention is directed to a memory circuit and, more particularly, a memory circuit having an array of memory cells wherein at least one cell in the array is a reference memory cell.

A print head on a printer (e.g., an ink-jet printer) typically includes a memory circuit located directly on the print head for storing various data. For example, the memory circuit may store data such as the type of ink/toner cartridge being used, the type of printer, the amount of ink/toner used, diagnostic data and the like.

The memory circuit may be an array of memory cells. One such memory array is a floating gate memory array utilizing CMOS EPROM technology. The floating gate memory array is a two-dimensional array of memory cells, wherein each cell may be programmed to store data. An alternative memory array is a fuse memory array.

The memory array may operate as follows. Initially, each data cell is in a native (i.e., unprogrammed) state and therefore corresponds to a digital "0." The cell is programmed by converting the digital "0" into a digital "1" when a sufficient voltage (e.g., 10 volts) is applied to the cell.

Thus, data may be stored to the memory array by selectively programming cells in the array. In contrast, data may be read from the memory array by applying a second voltage to the cell (e.g., 2.5 volts) and measuring the current generated. The second voltage is not sufficient to write to (i.e., program) the cell. The generated current is compared to a reference current to determine whether a particular cell is programmed or unprogrammed.

Variations in the applied voltage/current throughout the memory circuit may cause inaccuracies that negatively affect the reliability of the circuit. Accordingly, there is a need for a circuit that addresses the variation in the applied voltage/current such that an accurate determination of whether or not a cell has been programmed can be made.

SUMMARY

One embodiment of the present invention is a memory circuit comprising a source, a plurality of memory cells switchably connected to the source and configured in an array, wherein at least one of the memory cells is a reference memory cell and at least one of the remaining cells are data memory cells, and at least one sense amplifier adapted to compare at least one of a current and voltage received from the reference memory cell with at least one of a current and voltage received from one of the data memory cells, and generate an output based on the comparison.

A second embodiment of the present invention is a method for determining the digital state of a data memory cell, comprising providing an array of memory cells, wherein at least one of the memory cells is a reference memory cell and at least one of the remaining memory cells are data memory cells, applying a source to the reference memory cell to generate at least one of a current and voltage from the reference memory cell, applying a source to one of the data memory cells to generate at least one of a current and voltage from the data memory cell, comparing the at least one of a current and voltage from the reference memory cell with the at least one of a current and voltage from the data memory cell, and generating an output based on the comparison.

Other embodiments, objects, features and advantages of the present invention will become apparent to those skilled in the art from the detailed description, the accompanying drawings and the appended claims.

BRIEF DESCRIPTION OF THE DRAWINGS

The invention can be understood with reference to the following drawings. In the drawings, like reference numerals designate corresponding parts throughout the several views.

DETAILED DESCRIPTION

Figure 1:
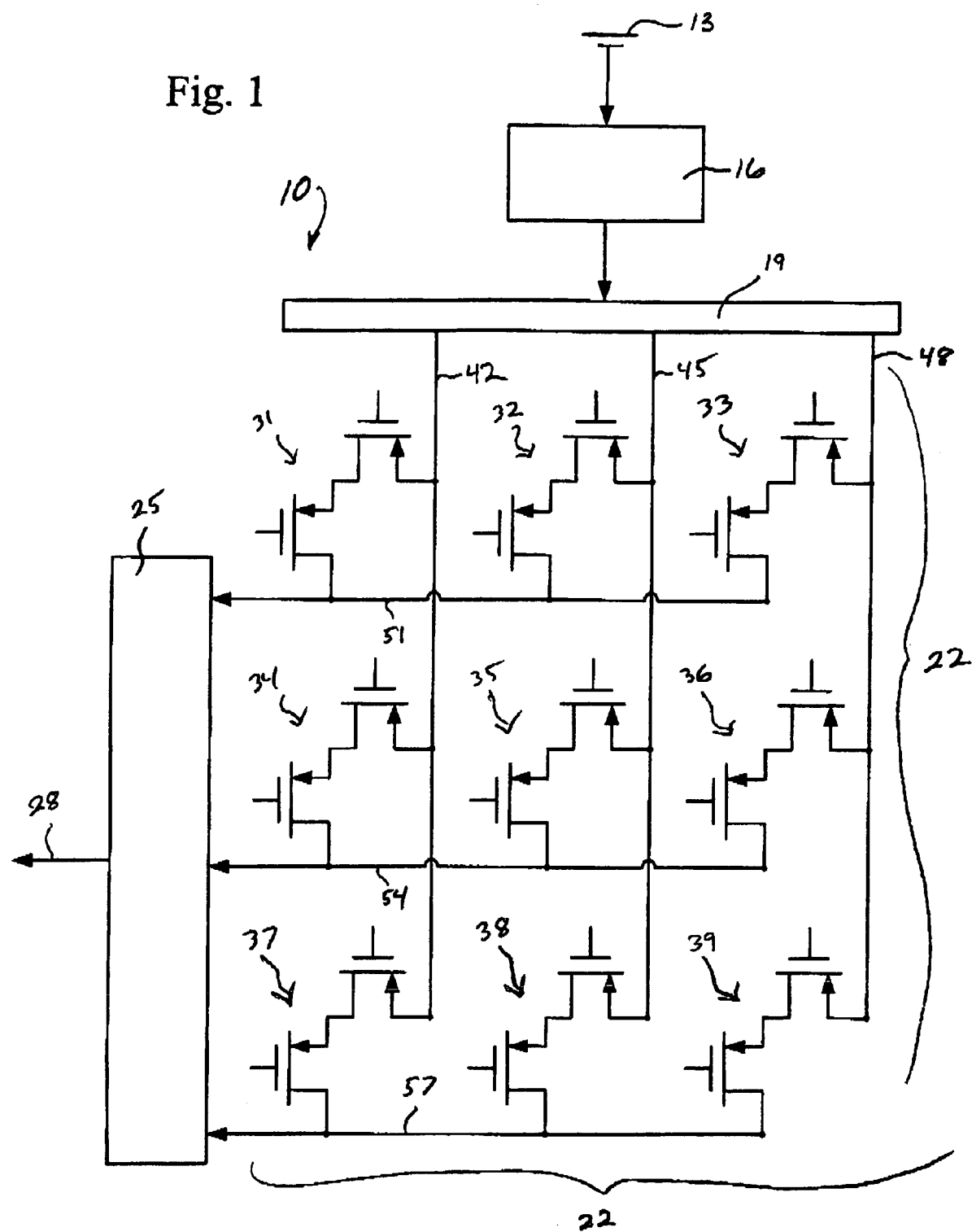
FIG. 1 is a schematic diagram of a memory circuit according to one embodiment of the present invention.

As shown in FIG. 1, memory circuit 10 can include a source, such as a voltage source or input 13, a voltage regulator 16, a power rail 19, an array 22 of memory cells 31, 32, 33, 34, 35, 36, 37, 38, 39, a sense amplifier 25, an output 28, feed lines 42, 45, 48 and exit lines 51, 54, 57.

The voltage regulator 16 regulates the voltage source or input 13 (e.g., 11 volts), which may be a battery, a connection to a printer power source (not shown) or the like, between a first voltage, corresponding to a read mode (e.g., 2.5 volts), and a second voltage, corresponding to a write mode (e.g., 10 volts). An example of an acceptable voltage regulator 16 for use according to the present invention is the voltage regulating circuit described in U.S. Ser. No. 10/961,464 filed on Oct. 8, 2004, the entire contents of which are incorporated herein by reference. The power rail 19 distributes the first and second voltages (depending on whether the circuit 10 is in the read mode or the write mode) throughout the array 22 of memory cells 31, 32, 33, 34, 35, 36, 37, 38, 39 by way of the feed lines 42, 45, 48.

The array 22 may be a two-dimensional array of cells 31, 32, 33, 34, 35, 36, 37, 38, 39 comprised of X number of columns and Y number of rows to provide Z number of memory cells, where Z is equal to X times Y. The array 22 may be a floating gate memory array, a fuse memory array or other like memory array. For example, as illustrated in FIG. 1, the array 22 includes three columns and three rows for a total of nine memory cells 31, 32, 33, 34, 35, 36, 37, 38, 39. At this point, it should be obvious to one skilled in the art that the array 22 may include any number of rows and columns without departing from the scope of the present invention.

Figure 2:
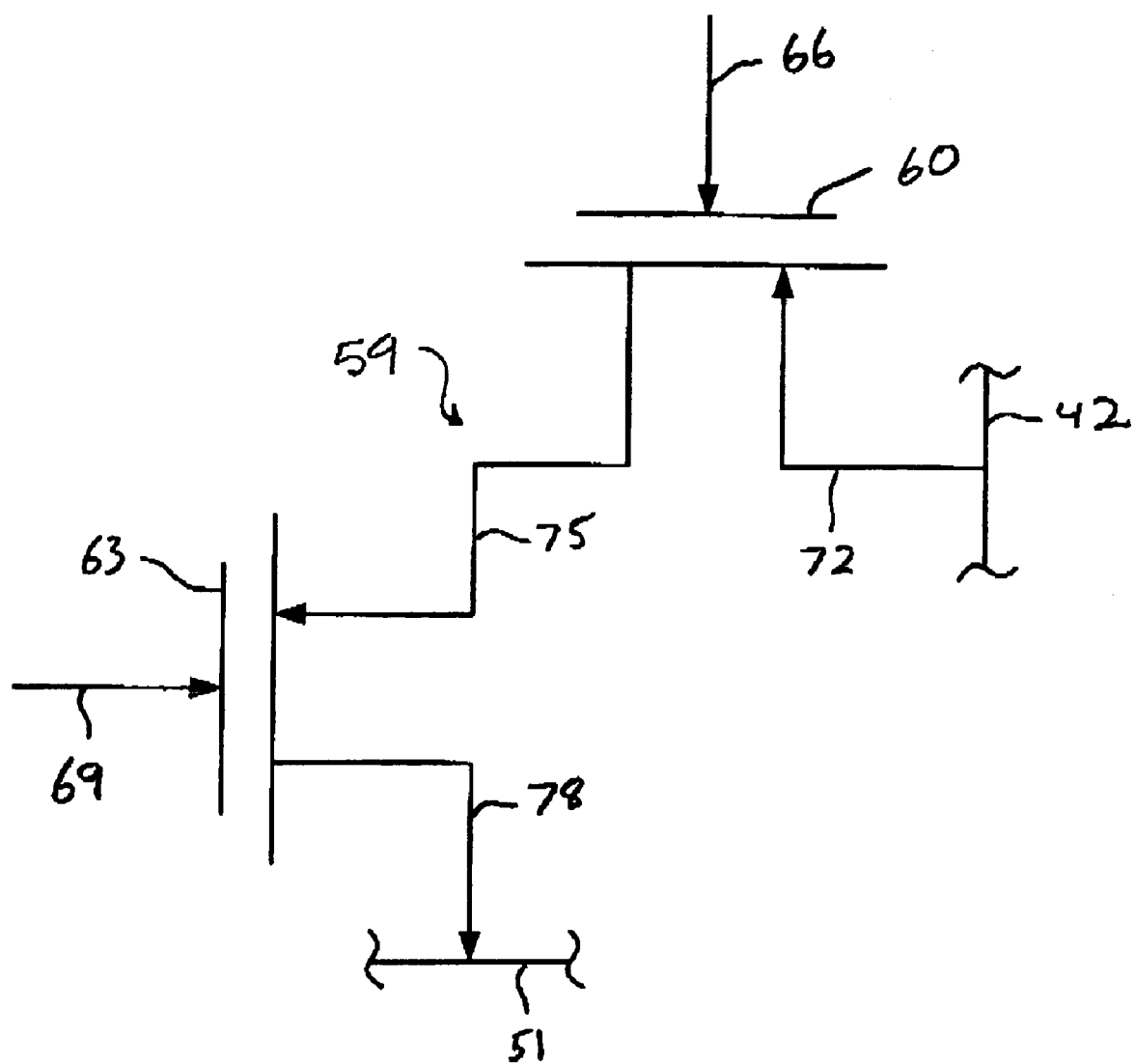
FIG. 2 is a schematic diagram of a memory cell of the memory circuit of FIG. 1.

FIG. 2 is an enlarged view of a memory cell 59, which is representative of at least one of cells 31, 32, 33, 34, 35, 36, 37, 38, 39. Cell 59 includes a first transistor 60, a second transistor 63 that acts as a memory element, a first control input 66, input lead 72, connecting lead 75 and output lead 78. Input lead 72 is connected to feed line 42 and transistor 60. Connecting lead 75 is connected to transistor 60 and transistor 63. Output lead 78 is connected to transistor 63 and exit line 51. The first control input 66 controls transistor 60 (i.e., switches transistor 60 on (active) such that current/voltage can pass or switches transistor 60 off (inactive) such that current/voltage cannot pass) by applying various voltages to the transistor 60 (e.g., 3.3 volts corresponds to transistor 60 being active and 0 volts corresponds to the transistor 60 being inactive). Transistor 63 acts as a memory element. Programming 63 causes the transistor 63 to behave as if the transistor control input 69 is active and the transistor 63 is switched on and passing voltage/current. Leaving transistor 63 in the unprogrammed or native state causes the transistor 63 to behave as if the transistor control input 69 is inactive and the transistor 63 is switched off and not passing voltage/current. A two terminal fuse element connected between lead 72 and 78 is an alternative to transistor 63. When both transistors 60, 63 are active (i.e., switched on), current/voltage may enter and pass through the cell 59 (i.e., voltage may be applied to the cell by way of input lead 72 connected to the feed line 42 and output 78 connected to feed line 51.

At least one of the cells 31, 32, 33, 34, 35, 36, 37, 38, 39 in the array 22 (see FIG. 1) is designated as a reference memory cell and the remaining cells can be data memory cells. The reference memory cell may be initially programmed (e.g., be applying 10 volts) such that, when a read mode voltage (e.g., 2.5 volts) is applied to the reference cell, a reference current is generated that corresponds to a programmed cell. Alternatively, the reference cell may remain in its native state such that, when a read mode voltage is applied to the reference cell, a reference current is generated that corresponds to an unprogrammed cell.

A better comparison is obtained between a generated current (i.e., a current generated by a data cell when the data cell is being read) and the reference current when the reference current is generated within the array 22. Furthermore, a reference current generated within the array 22 addresses the problems associated with variation in the read/write current or voltage because the reference cell or cells will be subjected to the same process variations (e.g., voltage variations) as the data cells in the array 22.

For example, cell 33 may be designated as a reference memory cell and cells 31, 32, 34, 35, 36, 37, 38, 39 may be data memory cells. Cell 33 may be initially programmed such that it provides a reference current when a read voltage is applied to the cell 33. Accordingly, when the circuit 10 desires to read cell 37, for example, a read voltage (e.g., 2.5 volts) is provided to the array 22 by the power rail 19, control input 66 activates transistors 60 and programming has activated transistor 63 in the reference cell 33 and in the data cell 37, such that the reference cell 33 and the data cell 37 generate a current. The current from the reference cell 33 is supplied to the sense amplifier 25 by way of exit line 51 and the generated current from data cell 37 is supplied to the sense amplifier 25 by way of exit line 57. The sense amplifier 25 compares the reference current to the generated current and generates an output 28. The output 28 may be a high voltage (corresponding to a digital 1) when the reference current is substantially equal to the generated current (i.e., data cell 37 is programmed) or the output 28 may be a low voltage (corresponding to a digital 0) when the reference current is not equal to the generated current (i.e., data cell 37 is not programmed).

According to a second embodiment of the present invention, an entire column of the array 22 may consist of reference cells. For example, cells 33, 36, 39 may be reference cells and cells 31, 32, 34, 35, 37, 38 may be data cells. Therefore, the generated current from data cells in a particular row may be compared to a reference current generated by a reference cell in that particular row such that vertical variations in the applied voltage may be tracked.

According to a third embodiment of the present invention, an entire row of the array may consist of reference cells.

Although the invention is shown and described with respect to certain embodiments, it is obvious that equivalents and modifications will occur to those skilled in the art upon reading and understanding the specification. For example, although the present invention has been principally described with respect to an embodiment wherein a program source and a read source comprise a voltage input, and a comparison is made with respect to current, one of ordinary skill in the art can appreciate that other combinations of program sources, read sources, and comparisons could be used, such as the combinations shown in the below matrix.

| Program Source | Read Source | Comparison |
|---|---|---|
| Voltage | Voltage | Current |
| Voltage | Voltage | Voltage |
| Voltage | Current | Current |
| Voltage | Current | Voltage |
| Current | Current | Current |
| Current | Current | Voltage |
| Current | Voltage | Current |
| Current | Voltage | Voltage |

The present invention includes all such equivalents and modifications and is limited only by the scope of the claims.

What is claimed is:

1. A memory circuit for an inkjet print head comprising:
    a plurality of memory cells switchably connected to a source and configured in an array, wherein at least one of said memory cells is a reference memory cell and at least one of said memory cells is a data memory cell, said at least one reference memory cell being in a programmed state; and
    at least one sense amplifier adapted to compare at least one of a current and voltage received from said at least one reference memory cell with at least one of a current and voltage received from said at least one data memory cell, and generate an output based on said comparison.

2. The memory circuit of claim 1 wherein said array includes an array of floating gate memory cells.

3. The memory circuit of claim 1 wherein said array includes an array of fuse memory cells.

4. The memory circuit of claim 1 wherein said array includes a two-dimensional array having at least two columns and at least two rows.

5. The memory circuit of claim 4 wherein said memory cells include a plurality of said reference memory cells and at least one column in said array is a column of said reference memory cells.

6. The memory circuit of claim 4 wherein said memory cells include a plurality of said reference memory cells and at least one row in said array is a row of said reference memory cells.

7. The memory circuit of claim 1 wherein said output of said sense amplifier is a relatively high voltage when a current received from said reference memory cell is approximately equal to a current received from one of said data memory cells.

8. The memory circuit of claim 7 wherein said high voltage corresponds to a digital "1."

9. The memory circuit of claim 1 wherein said output of said sense amplifier is a relatively low voltage when a current received from said reference memory cell substantially differs from a current received from one of said data memory cells.

10. The memory circuit of claim 9 wherein said low voltage corresponds to a digital "0"

11. A method for determining the digital state of a target data memory cell in an array of memory cells associated with an inkjet print head, said array of memory cells including at least one reference memory cell and at least one data memory cell, comprising:
- initially programming said at least one reference memory cell;
- applying a selected source to said reference memory cell to generate at least one of a current and voltage from said reference memory cell;
- applying a source to said target data memory cell to generate at least one of a current and voltage from said target data memory cell;
- comparing said at least one of a current and voltage from said reference memory cell with said at least one of a current and voltage from said target data memory cell; and
- generating an output based on said comparison.

12. The method of claim 11 wherein said array of memory cells includes a floating gate memory array.

13. The method of claim 11 wherein said array of memory cells includes an array of fuse memory cells.

14. The method of claim 11 wherein said array is a two-dimensional array including at least two columns and at least two rows.

15. The method of claim 14 wherein at least one column in said array includes a column of reference cells.

16. The method of claim 14 wherein at least one row in said array includes a row of reference cells.

17. The method of claim 11 wherein said output is a relatively high voltage when a current from said data memory cell is approximately equal to a current from said one of said reference memory cells.

18. The method of claim 11 wherein said output is a relatively low voltage when a current from said data memory cell is substantially different than a current from said one of said reference memory cells.

19. The method of claim 11 wherein said output is a relatively high voltage when a voltage from said data memory cell is approximately equal to a voltage from said reference memory cells.

20. The method of claim 11 wherein said output is a relatively low voltage when a voltage from said data memory cell is substantially different than a voltage from said one of said reference memory cells.

21. The method of claim 11 wherein the selected source comprises a selected voltage.

* * * * *